United States Patent
Yasukawa et al.

(10) Patent No.: US 9,362,434 B2
(45) Date of Patent: Jun. 7, 2016

(54) BACK SIDE PROTECTIVE SHEET FOR SOLAR CELL AND SOLAR CELL MODULE COMPRISING THE SAME

(75) Inventors: Hidenori Yasukawa, Osaka (JP); Masateru Watanabe, Osaka (JP); Makoto Hosaka, Osaka (JP); Hiroyuki Sakamoto, Osaka (JP)

(73) Assignee: TOYO ALUMINIUM KABUSHIKI KAISHA, Osaka (JP)

( * ) Notice: Subject to any disclaimer, the term of this patent is extended or adjusted under 35 U.S.C. 154(b) by 691 days.

(21) Appl. No.: 12/524,103

(22) PCT Filed: Feb. 15, 2008

(86) PCT No.: PCT/JP2008/052485
§ 371 (c)(1),
(2), (4) Date: Jul. 22, 2009

(87) PCT Pub. No.: WO2008/105241
PCT Pub. Date: Sep. 4, 2008

(65) Prior Publication Data
US 2010/0089445 A1    Apr. 15, 2010

(30) Foreign Application Priority Data
Feb. 27, 2007 (JP) .................. 2007-047215

(51) Int. Cl.
*H01L 31/00* (2006.01)
*H01L 31/048* (2014.01)
(Continued)

(52) U.S. Cl.
CPC ............ *H01L 31/048* (2013.01); *B32B 7/12* (2013.01); *B32B 17/10018* (2013.01);
(Continued)

(58) Field of Classification Search
CPC .... B32B 7/12; B32B 17/10788; B32B 27/08; B32B 27/304; B32B 27/308; B32B 27/32; B32B 17/10018; B32B 2250/02; B32B 2250/246; B32B 2270/00; B32B 2307/712; H01L 31/049; H01L 31/048; C08L 27/16; C08L 33/12
USPC .................................................. 136/251, 256
See application file for complete search history.

(56) References Cited

U.S. PATENT DOCUMENTS

| | | | | |
|---|---|---|---|---|
| 4,272,585 | A | * | 6/1981 | Strassel .................... 428/413 |
| 4,948,642 | A | * | 8/1990 | Shantz et al. ................ 428/35.7 |

(Continued)

FOREIGN PATENT DOCUMENTS

| | | |
|---|---|---|
| EP | 1 279 494 A1 | 1/2003 |
| EP | 1 826 826 A1 | 8/2007 |

(Continued)

OTHER PUBLICATIONS

Inoue, JP2669675B2, Machine Translation, Nov. 1997.*
(Continued)

*Primary Examiner* — Devina Pillay
(74) *Attorney, Agent, or Firm* — Birch, Stewart, Kolasch & Birch, LLP

(57) ABSTRACT

A back side protective sheet for a solar cell, which is capable of enhancing performance of adhesion to an EVA resin as a filler used to seal solar cell elements, maintaining weather resistance for a long period of time, and reducing weight thereof; and a solar cell module including the back side protective sheet for a solar cell. The back side protective sheet is disposed on a back side of the solar cell module and includes: a first film fixedly attached so as to abut a surface of a filler and containing linear low-density polyethylene having a density greater than or equal to 0.91 g/cm$^3$ and less than or equal to 0.93 g/cm$^3$; and a second film laminated to the first film and disposed in an outermost layer of the back side protective sheet, the second film containing polyvinylidene fluoride and polymethyl methacrylate.

5 Claims, 1 Drawing Sheet

(51) Int. Cl.
  *B32B 7/12* (2006.01)
  *B32B 17/10* (2006.01)
  *B32B 27/08* (2006.01)
  *B32B 27/30* (2006.01)
  *B32B 27/32* (2006.01)
  *C08L 27/16* (2006.01)
  *C08L 33/12* (2006.01)
  *H01L 31/049* (2014.01)

(52) U.S. Cl.
  CPC .......... *B32B 17/10788* (2013.01); *B32B 27/08* (2013.01); *B32B 27/304* (2013.01); *B32B 27/308* (2013.01); *B32B 27/32* (2013.01); *C08L 27/16* (2013.01); *C08L 33/12* (2013.01); *H01L 31/049* (2014.12); *B32B 2250/02* (2013.01); *B32B 2250/246* (2013.01); *B32B 2270/00* (2013.01); *B32B 2307/712* (2013.01); *B32B 2307/72* (2013.01); *B32B 2457/12* (2013.01); *Y02E 10/50* (2013.01)

(56) References Cited

U.S. PATENT DOCUMENTS

| | | | |
|---|---|---|---|
| 5,476,553 A * | 12/1995 | Hanoka et al. | 136/251 |
| 6,407,329 B1 * | 6/2002 | Iino et al. | 136/251 |
| 6,811,859 B2 * | 11/2004 | Bonnet et al. | 428/216 |
| 2002/0020440 A1 * | 2/2002 | Yoshimine et al. | 136/251 |
| 2002/0129848 A1 | 9/2002 | Miura et al. | |
| 2005/0067007 A1 * | 3/2005 | Toft | 136/245 |
| 2005/0187354 A1 * | 8/2005 | Bonnet et al. | 525/276 |
| 2009/0104441 A1 * | 4/2009 | Sawada | B29C 45/14811 428/337 |

FOREIGN PATENT DOCUMENTS

| | | | | |
|---|---|---|---|---|
| JP | 58-193646 U | 12/1983 | | |
| JP | 61-274373 A | 4/1985 | | |
| JP | 61-274373 A | 12/1986 | | |
| JP | 2-151437 A | 6/1990 | | |
| JP | 8-47959 A | 2/1995 | | |
| JP | 8-174734 A | 7/1995 | | |
| JP | 2669675 B2 * | 11/1997 | ............. | B32B 27/08 |
| JP | 10-190023 A | 7/1998 | | |
| JP | 10-308521 A | 11/1998 | | |
| JP | 11-261085 A | 9/1999 | | |
| JP | 2000-6326 A | 1/2000 | | |
| JP | 2000-258880 A | 9/2000 | | |
| JP | 2000-277777 A | 10/2000 | | |
| JP | 2000-294813 A | 10/2000 | | |
| JP | 2001-111077 A | 4/2001 | | |
| JP | 2001196618 * | 7/2001 | ................ | B32B 9/00 |
| JP | 2002-6748 A | 1/2002 | | |
| JP | 2003-347570 A | 12/2003 | | |
| JP | 2004-223925 A | 8/2004 | | |
| JP | 2004-352966 a | 12/2004 | | |
| JP | 2005-118032 A | 5/2005 | | |
| JP | 2008-299162 A | 11/2006 | | |
| JP | 2006-335853 A | 12/2006 | | |
| WO | WO-02/072349 A1 | 9/2002 | | |
| WO | WO-2005/042625 A1 | 5/2005 | | |
| WO | WO2006/090786 A1 * | 8/2006 | ............. | B29C 45/14 |

OTHER PUBLICATIONS

Okawa, JP2001196618, Machine Translation, Jul. 2001.*
"Relationship between the density and melting point of PEs", Practical Plastics Dictionary, Materials Part, pp. 15-17, May 1, 1993.
Supplemental European Search Report dated Sep. 1, 2015 for EP No. 08711315.5.

* cited by examiner

BACK SIDE PROTECTIVE SHEET FOR SOLAR CELL AND SOLAR CELL MODULE COMPRISING THE SAME

TECHNICAL FIELD

The present invention relates generally to a back side protective sheet for a solar cell disposed on a back side of a solar cell module and to a solar cell module comprising the back side protective sheet. More particularly, the present invention relates to a back side protective sheet for a solar cell, which has weather resistance, and to a solar cell module comprising the back side protective sheet.

BACKGROUND ART

Because of the nature of a solar cell module, it is often the case that a solar cell module is installed outdoors. Therefore, in order to protect solar cell elements, electrodes, wires, and the like, for example, a transparent glass plate is disposed on a front side thereof and, for example, a laminated sheet of aluminum foil and a resin film, a laminated sheet of resin films, or the like is disposed on a back side thereof.

For example, proposed in Japanese Patent Application Laid-Open Publication No. 11-261085 (Patent Document 1) is a back side protective sheet for a solar cell, which includes a sheet of a polyethylene resin having a density greater than or equal to 0.94 g/cm$^3$ and less than or equal to 0.97 g/cm$^3$ and has weather resistance and a moisture-proof property.

In addition, for example, proposed in Japanese Patent Application Laid-Open Publication No. 2000-294813 (Patent Document 2) is a back cover material for a solar cell, comprising an outer film and a moisture-proof film which are laminated and integrated by using an ethylene-vinyl acetate copolymer adhesive, the moisture-proof film having a film whose base material surface has thereon a coating film formed of an inorganic oxide. Here, a fluorocarbon resin film such as a polyvinylidene fluoride film (PVDF) and a polyvinyl fluoride film (PVF) is used as the outer film, and a thickness of the outer film is 12 to 200 µm.

Patent Document 1: Japanese Patent Application Laid-Open Publication No. 11-261085
Patent Document 2: Japanese Patent Application Laid-Open Publication No. 2000-294813

DISCLOSURE OF THE INVENTION

Problems to be Solved by the Invention

By the way, the back side protective sheet for a solar cell is adhered, by using a hot-press, to an outer surface of an ethylene-vinyl acetate copolymer (EVA) resin as a filler used to seal solar cell elements.

However, although the back side protective sheet for a solar cell proposed in the above-mentioned Japanese Patent Application Laid-Open Publication No. 11-261085 (Patent Document 1) has weather resistance in early stages of use, the back side protective sheet for a solar cell has a problem of inferior adherence to the EVA resin as the filler used to seal the solar cell elements. Therefore, because this back side protective sheet for a solar cell becomes unable to maintain the adherence over time, it is likely that the back side protective sheet for a solar cell is exfoliated, becoming unable to protect the back side of the solar cell module and thus, cannot maintain the weather resistance for a long period of time.

The back cover material for a solar cell proposed in Japanese Patent Application Laid-Open Publication No. 2000-294813 has the weather resistance because the fluorocarbon resin film such as the PVDF and the PVF is used as the outer film. However, because these fluorocarbon resin films are inferior in processability, it is difficult to thin these films so as to have a thickness less than or equal to 40 µm. Therefore, it is difficult to reduce an overall weight of the whole solar cell module and the back side protective sheet. In addition, because these fluorocarbon resin films are inferior in wettability, there also arises a problem that in a case where these fluorocarbon resin films are laminated on other resin film, a sufficient adhesion force cannot be attained.

Therefore, objects of the present invention are to provide a back side protective sheet for a solar cell, which is capable of enhancing the performance of adhesion to the EVA resin as the filler used to seal the solar cell elements, of maintaining the weather resistance, and of reducing the weight; and to provide a solar cell module comprising the back side protective sheet for a solar cell.

Means for Solving the Problems

A back side protective sheet for a solar cell according to the present invention is disposed on a back side of a solar cell module, comprising: a first film which contains linear low-density polyethylene having a density greater than or equal to 0.91 g/cm$^3$ and less than or equal to 0.93 g/cm$^3$; and a second film which contains polyvinylidene fluoride and polymethyl methacrylate and is laminated on the first film.

A solar cell module according to the present invention comprises: a filler which is disposed to seal solar cell elements and made of an ethylene-vinyl acetate copolymer resin; and a back side protective sheet for a solar cell, which is fixedly attached on an outer surface of the filler on a back side of the solar cell module. The back side protective sheet for a solar cell includes: a first film which is fixedly attached so as to abut a surface of the filler and contains linear low-density polyethylene having a density greater than or equal to 0.91 g/cm$^3$ and less than or equal to 0.93 g/cm$^3$; and a second film which is laminated on the first film and disposed in an outermost layer of the back side protective sheet for a solar cell and contains polyvinylidene fluoride and polymethyl methacrylate.

Effect of the Invention

In the back side protective sheet for a solar cell according to the present invention, the first film which contains the linear low-density polyethylene having the density greater than or equal to 0.91 g/cm$^3$ and less than or equal to 0.93 g/cm$^3$ is excellent in performance of adhesion to the filler, which is disposed to seal the solar cell elements and made of the ethylene-vinyl acetate copolymer resin, and is capable of maintaining the adhesion performance over time. In addition, the second film containing the polyvinylidene fluoride and the polymethyl methacrylate is disposed in the outermost layer of the back side protective sheet for a solar cell, thereby exhibiting the weather resistance and allowing a thickness thereof to be thinned so as to be 40 µm or less because processability thereof is fine as compared with a fluorocarbon resin film. For example, in a case where the second film is laminated on the first film by using a dry laminate adhesive through employing a dry lamination method, the second film enables a sufficient adhesion force to be attained.

Therefore, according to the present invention, the performance of adhesion of the back side protective sheet to the EVA resin as the filler used to seal the solar cell elements can be enhanced, the weather resistance of the back side protective sheet can be maintained for a long period of time, and the weight of the back side protective sheet for a solar cell and the solar cell module can be reduced.

EXPLANATION OF REFERENCE NUMERALS

10: back side protective sheet for a solar cell, 11: first film, 12: second film, 100: solar cell module.

BEST MODE FOR CARRYING OUT THE INVENTION

Figure 1:
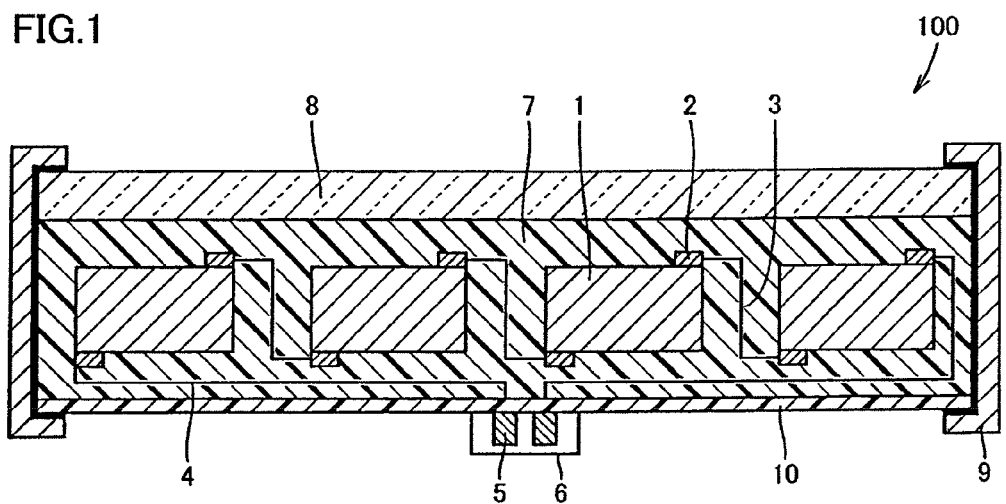
FIG. 1 is a schematic diagram illustrating a cross section structure of a solar cell module to which a back side protective sheet for a solar cell, as one embodiment according to the present invention, is applied.

FIG. 1 is a schematic diagram illustrating a cross section structure of a solar cell module to which a back side protective sheet for a solar cell, as one embodiment according to the present invention, is applied.

As shown in FIG. 1, a multitude of solar cell elements 1 are arranged in the solar cell module 100. These solar cell elements 1 are electrically connected to each other via electrodes 2 by connection wires 3. In the whole solar cell module 100, terminals 5 are led out to a back side thereof by lead wires 4, and the terminals 5 are housed in a terminal box 6. A filler 7 made of an ethylene-vinyl acetate copolymer (EVA) resin is disposed to seal the multitude of solar cell elements 1. On an outer surface of the filler 7, which is located on a light receiving surface side of the solar cell module 100, a transparent glass layer 8 is fixedly attached. On an outer surface of the filler 7, which is located on an installation surface side of the solar cell module 100, the back side protective sheet 10 for a solar cell is fixedly attached. On side surfaces of the solar cell module 100, a frame member 9 made of aluminum is attached via a sealant.

Figure 2:
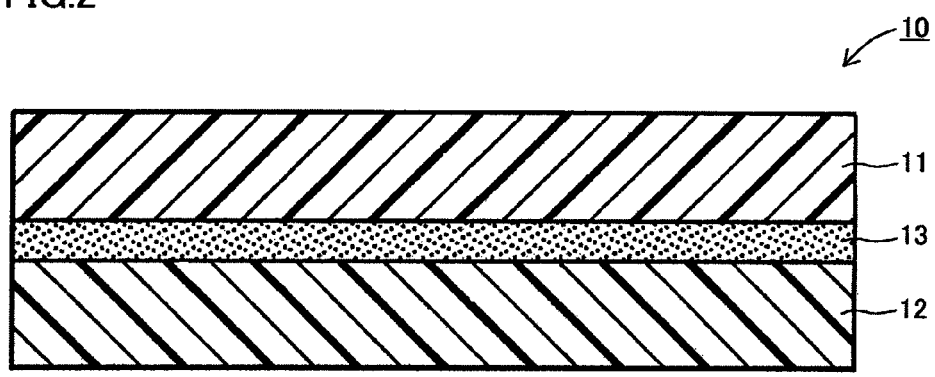
FIG. 2 shows a cross section view of the back side protective sheet for a solar cell, as the one embodiment according to the present invention.

FIG. 2 shows a cross section view of the back side protective sheet for a solar cell, as the one embodiment according to the present invention.

As shown in FIG. 2, in the back side protective sheet 10 for a solar cell, a first film 11 which contains linear low-density polyethylene (LLDPE) having a density greater than or equal to 0.91 g/cm$^3$ and less than or equal to 0.93 g/cm$^3$ and a second film 12 made of a mixture resin film containing polyvinylidene fluoride (PVDF) and polymethyl methacrylate (PMMA) are laminated in order from an inner layer disposed on a side (inner side) relatively close to the solar cell module 100. Between the first film 11 and the second film 12, an adhesive layer 13 is disposed. The first film 11 is fixedly attached so as to abut a surface of the filler 7. This attachment is conducted by using a hot-press. The second film 12 is disposed in an outermost layer of the back side protective sheet 10 for a solar cell. The adhesive layer 13 is made of a dry laminate adhesive. A thickness of the first film 11 is approximately 30 to 100 μm and a thickness of the second film 12 is approximately 5 to 30 μm. It is preferable that a mixing ratio of the polyvinylidene fluoride (PVDF) and the polymethyl methacrylate (PMMA) contained in the mixture resin film as the second film 12 is PVDF/PMMA=1/9 to 9/1.

On the respective surfaces of the first film 11 and the second film 12, an anchor coat agent or the like may be applied according to need.

For the purpose of absorbing or reflecting ultraviolet rays, a white pigment such as a titanium oxide and a barium sulfate may be mixed in the second film 12.

In order to improve performance of adhesion to the filler 7, a primer layer may be formed on a light receiving surface side of the first film 11. It is preferable to use as a primer agent an acrylic primer, a polyester primer, or the like. An amount of application of the primer agent may be approximately 2 to 15 g/m$^2$.

The first film 11 and the second film 12 can be laminated by employing the heretofore known method. For example, a method in which the first film 11 and the second film 12 are laminated with the adhesive layer 13 interposed therebetween as shown in FIG. 2 by employing a dry lamination method using a two-part curable polyurethane adhesive, a polyether polyurethane adhesive, a polyester adhesive, a polyester polyol adhesive, a polyester polyurethane polyol adhesive, or the like may be adopted. In addition to the above-mentioned method, a thermal lamination method or the like using a co-extrusion coat agent, an extrusion coat agent, or an anchor coat agent may be adopted. It is preferable to adopt the dry lamination method to laminate the first film 11 and the second film 12, and in particular, it is preferable to adopt the dry lamination method using an adhesive containing a urethane resin.

EXAMPLE

Test samples of an example, comparison examples, and a reference example of the back side protective sheet for a solar cell were prepared as described below.

Example 1

On a surface of an LLDPE film (which was manufactured by Tohcello Co., Ltd., has a product name of T.U.X-HC, and has a density of 0.914 g/cm$^3$) having a thickness of 60 μm as the first film, a mixture resin film (a mixing ratio: 8 parts by weight of PVDF to 2 parts by weight of PMMA) (which was manufactured by DENKI KAGAKU KOGYO KABUSHIKI KAISHA and has a product name of DENKA DX) having a thickness of 20 μm as the second film was bonded by using a dry laminating adhesive through employing a dry lamination method. As the dry laminating adhesive, a urethane adhesive that was a mixture of a product named "Takerack A315" (100 parts by weight) and a product named "Takenato A50" (10 parts by weight), both of which were manufactured by Mitsui Chemicals Polyurethanes Co., Ltd., was used with a solid content coated amount of 3 g/m$^2$. As described above, the back side protective sheet as the example of the present invention was prepared.

Comparison Example 1

A high density polyethylene (HDPE) film (which is manufactured by Tamapoly Co., Ltd., has a product name of HD, and has a density of 0.945 g/cm$^3$) having a thickness of 80 μm was used as the example compared with the back side protective sheet of the present invention.

Comparison Example 2

On a surface of a PVF film (which is manufactured by DuPont Co., Ltd. and has a product name of Tedlar) having a thickness of 40 μm, a PVF film (which is manufactured by DuPont Co., Ltd. and has a product name of Tedlar) having a thickness of 40 μm was bonded by using a dry laminating adhesive through employing a dry lamination method. As the dry laminating adhesive, a urethane adhesive that was a mixture of a product named "Takerack A315" (100 parts by weight) and a product named "Takenato A50" (10 parts by weight), both of which were manufactured by Mitsui Chemicals Polyurethanes Co., Ltd., was used with a solid content coated amount of 3 g/m². As described above, a back side protective sheet as the example compared with the present invention was prepared.

Reference Example

On a surface of an HDPE film (which was manufactured by Tamapoly Co., Ltd., has a product name of HD, and has a density of 0.945 g/cm³) having a thickness of 80 μm as a first film, a mixture resin film (a mixing ratio: 8 parts by weight of PVDF to 2 parts by weight of PMMA) (which was manufactured by DENKI KAGAKU KOGYO KABUSHIKI KAISHA and has a product name of DENKA DX) having a thickness of 20 μm as a second film was bonded by using a dry laminating adhesive through employing a dry lamination method. As the dry laminating adhesive, a urethane adhesive that was a mixture of a product named "Takerack A315" (100 parts by weight) and a product named "Takenato A50" (10 parts by weight), both of which were manufactured by Mitsui Chemicals Polyurethanes Co., Ltd., was used with a solid content coated amount of 3 g/m². As described above, a back side protective sheet as the reference example of the present invention was prepared.

By using the obtained back side protective sheets for solar cells, dummy solar cell modules were prepared. Specifically, each of the dummy solar cell modules was prepared through laminating, on a glass plate having a thickness of 3 mm and an area of 15 cm²×18 cm², an EVA resin (which was manufactured by Mitsui Chemicals Fabro, Inc. and has a product name of SOLAR EVA RC-01) having a thickness of 0.8 mm and an area of 15 cm²×18 cm² and each of the back side protective sheets having an area of 15 cm²×18 cm² in order such that three sides of the glass plate, EVA resin, and back side protective sheet overlap and through pressurizing the glass plate, EVA resin, and back side protective sheet by using an atmosphere hot-press. Under the following two atmosphere hot-press conditions, the dummy solar cell modules were prepared.

A) The pressurization was performed by using an atmosphere hot-press at a temperature of 150° C. for 5 minutes after vacuum defoaming processing at a temperature of 150° C. for 15 minutes.

B) The pressurization was performed by using the atmosphere hot-press at a temperature of 120° C. for 5 minutes after the vacuum defoaming processing at a temperature of 120° C. for 15 minutes.

Initial physical properties and weather resistance of each of the solar cell modules prepared as described above were evaluated in the following manner.

(Initial Physical Properties)

A test specimen which has one open portion and a width of 15 mm was prepared by making, from a surface side of each of the back side protective sheets toward each of the EVA resins, a cut which has a depth of ((a thickness of each of the back side protective sheet)+5 μm), a width of 15 mm, and a length of 18 cm, and the test specimen was pulled at a pulling speed of 100 mm/minute. At this time, rupture stress values were measured and each of the rupture stress values was defined as an adhesion force (N/15 mm) between each of the EVA resins and each of the back side protective sheets. Here, in a case where this rupture stress value exceeds 40 (N/15 mm), a rupture of the back side protective sheet takes place before an exfoliation between the EVA resin and the back side protective sheet occurs. Therefore, an accurate adhesion force cannot be evaluated. In such a case, an adhesion force was evaluated as being greater than or equal to 40 (N/15 mm).

(Weather Resistance)

After each of the dummy solar cell modules prepared under the atmosphere hot-press condition A) was retained at a temperature of 85° C. in an atmosphere of a relative humidity of 85% for 3000 hours, an outer appearance of each of the back side protective sheets was observed and an adhesion force (N/15 mm) between each of the EVA resins and each of the back side protective sheets was measured. The measurement of the adhesion forces was conducted as similarly to the above-described measurement (of the initial physical properties).

The results of the above-described evaluation are shown in Table 1.

TABLE 1

|  | Atmosphere Hot-press Condition | Initial Properties Adhesion Force (N/15 mm) | Weather Resistance | |
| --- | --- | --- | --- | --- |
|  |  |  | Adhesion Force (N/15 mm) | Outer Appearance |
| Example | A | Greater than or equal to 40 | Greater than or equal to 40 | Not changed |
|  | B | Greater than or equal to 40 | — | — |
| Comparison Example 1 | A | Greater than or equal to 40 | 0 | Changed |
|  | B | 15 | — | — |
| Comparison Example 2 | A | 8 | 0 | Adhesion to EVA defective |
|  | B | 0 | — | — |
| Reference Example | A | Greater than or equal to 40 | 20 | Color slightly changed |
|  | B | 18 | — | — |

From the results shown in Table 1, it can be seen that the example of the present invention is capable of enhancing the performance of adhesion of the back side protective sheet to the EVA resin as the filler and maintaining the weather resistance of the back side protective sheet.

The described embodiment is to be considered in all respects only as illustrative and not restrictive. It is intended that the scope of the invention is, therefore, indicated by the appended claims rather than the foregoing description of the embodiment and that all modifications and variations coming within the meaning and equivalency range of the appended claims are embraced within their scope.

INDUSTRIAL APPLICABILITY

The back side protective sheet for a solar cell according to the present invention is disposed on a back side of a solar cell module to be used, is capable of enhancing performance of adhesion of the back side protective sheet to an EVA resin as a filler used to seal solar cell elements; of maintaining weather resistance of the back side protective sheet for a long period of time; and of reducing a weight of the back side protective sheet for a solar cell and the solar cell module.

The invention claimed is:

1. A solar cell module comprising:
   at least one solar cell element;
   a filler disposed to seal said solar cell element, said filler being made of an ethylene-vinyl acetate copolymer resin; and
   a back side protective sheet fixedly attached to an outer surface of the filler on a back side of the solar cell module,
   wherein the back side protective sheet includes:
      a first film fixedly attached so as to abut a surface of the filler and containing linear low-density polyethylene having a density greater than or equal to 0.91 g/cm$^3$ and less than or equal to 0.93 g/cm$^3$,
      a second film disposed in an outermost layer of the back side protective sheet, the second film containing polyvinylidene fluoride and polymethyl methacrylate, and
      a dry laminate adhesive layer containing a urethane resin disposed between the first film and the second film, whereby said first and second films are integrally laminated by said dry laminate adhesive layer containing the urethane resin.

2. The solar cell module of claim 1, wherein the second film has a thickness of 40 µm or less.

3. The solar cell module of claim 1, wherein a glass layer is fixedly attached to an outer surface of the filler.

4. The solar cell module of claim 3, wherein an aluminum frame member is attached to the side surfaces of the solar cell module.

5. A solar cell module which comprises:
   at least one solar cell element;
   a filler disposed to seal said solar cell element, said filler comprising an ethylene-vinyl acetate resin;
   a transparent glass layer disposed on one side of the filler; and
   a back side protective sheet disposed on the other side of the filler at a back side of the solar module; said back side protective sheet including a first film fixedly attached so as to abut a surface of the filler and containing linear, low-density polyethylene, a second film disposed in an outermost layer of the back side protective sheet, said second film containing polyvinylidene fluoride and polymethyl methacrylate, and
   a dry laminate adhesive layer containing a urethane resin disposed between the first film and the second film, whereby said first and second films are integrally laminated by said dry laminate adhesive layer containing the urethane resin,
   wherein said solar cell module exhibits a back side protective sheet of reduced weight and an enhanced adhesion of the back side protective sheet to the filler while maintaining weather resistance of the back side protective sheet.

* * * * *